(12) United States Patent
Morford (10) Patent No.: US 6,675,109 B2
(45) Date of Patent: Jan. 6, 2004

(54) SYSTEMS AND METHODS FOR FORMING DATA STORAGE DEVICES

(75) Inventor: Chris L. Morford, Eagle, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/273,696

(22) Filed: Oct. 18, 2002

(65) Prior Publication Data

US 2003/0069715 A1 Apr. 10, 2003

Related U.S. Application Data

(62) Division of application No. 09/931,784, filed on Aug. 16, 2001, now Pat. No. 6,584,416.

(51) Int. Cl.$^7$ ................................................ G11C 11/00
(52) U.S. Cl. ...................... 702/34; 702/129; 369/101; 369/270; 365/118
(58) Field of Search .................. 702/34, 129; 437/250; 369/44.14, 44.15, 101, 270; 315/111.4; 250/442.11, 492.3; 365/118

(56) References Cited

U.S. PATENT DOCUMENTS 5,516,732 A * 5/1996 Flegal ........................ 438/800
6,224,724 B1 * 5/2001 Licata et al. ............ 204/298.06
6,584,416 B2 * 6/2003 Morford ...................... 702/34

* cited by examiner

Primary Examiner—Kamini Shah (57) ABSTRACT

Systems for assembling wafer stacks are provided. An embodiment of the system includes a vacuum chamber, a media deposition component and a wafer stack assembly component. The media deposition component is arranged within the vacuum chamber and is configured to deposit storage media upon a first wafer. The wafer stack assembly component also is arranged within the vacuum chamber. The wafer stack assembly component is configured to align the first wafer and a second wafer relative to each other and bond the first wafer and the second wafer together while at least a portion of the vacuum chamber is maintained under vacuum pressure. So configured, the interior chamber of the wafer stack can be formed as well as maintained under vacuum pressure. Methods also are provided.

13 Claims, 11 Drawing Sheets

SYSTEMS AND METHODS FOR FORMING DATA STORAGE DEVICES

This application is a division of application Ser. No. 09/931,784, filed Aug. 16, 2001, now U.S. Pat. No. 6,584,416.

BACKGROUND OF THE INVENTION

1. Field of the Invention

The present invention generally relates to semiconductor fabrication. More specifically, the invention relates to systems and methods for forming data storage devices incorporating semiconductor wafers.

2. Description of the Related Art

Data storage devices that use atomic resolution storage (ARS) techniques for storing data can be formed of multiple wafers that are bonded together as a wafer stack. Such a wafer stack can be diced to form one or more data storage devices. Each data storage device typically includes multiple electron emitters and corresponding storage areas that are configured to store data.

Contamination of one or more surfaces of the various wafers of a wafer stack may degrade performance of data storage devices formed from that wafer stack. In particular, if some of the interior chambers of the wafer stack become contaminated, the performance of one or more of the emitters can be affected. This can inhibit the ability of a data storage device to store and/or retrieve data. Therefore, there is a need for improved systems and methods that address these and/or other shortcomings of the prior art.

SUMMARY OF THE INVENTION

Briefly described, the invention relates to semiconductor fabrication. In this regard, embodiments of the invention may be construed as providing systems for assembling wafer stacks. Some of these wafer stacks can be adapted to form one or more data storage devices, such a data storage device implementing atomic resolution storage techniques. A representative wafer stack includes a first wafer and a second wafer, with the first wafer and second wafer defining therebetween an interior chamber.

An embodiment of the system includes a vacuum chamber, a media deposition component and a wafer stack assembly component. The media deposition component is arranged within the vacuum chamber and is configured to deposit storage media upon the first wafer. The wafer stack assembly component also is arranged within the vacuum chamber. The wafer stack assembly component is configured to align the first wafer and a second wafer relative to each other and bond the first wafer and the second wafer together while at least a portion of the vacuum chamber is maintained under vacuum pressure. So configured, the interior chamber of the wafer stack can be formed as well as maintained under vacuum pressure.

Other embodiments of the invention may be construed as providing methods for forming data storage devices. A representative method includes: providing a first wafer and a second wafer, with the first wafer and second wafer being configured to define therebetween an interior chamber; maintaining the first wafer under vacuum pressure for a predetermined interval; depositing storage media upon the first wafer; removing contaminants from a vicinity of the first wafer; and bonding the first wafer and the second wafer together to form a wafer stack so that the interior chamber is maintained under vacuum pressure after the first wafer and second wafer are bonded together.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Reference will now be made to the drawings, wherein like reference numerals indicate corresponding parts throughout the several views. As described in greater detail hereinafter, vacuum assembly systems of the present invention are adapted to enable formation and assembly of wafer stacks. In particular, these wafer stacks can be processed, such as by dicing, to form data storage devices, e.g., data storage devices that implement atomic resolution storage (ARS) techniques for storing data. By assembling the wafers of the wafer stack using a vacuum assembly system, contamination of the various wafers of the wafer stack can be reduced. This can result in the formation of data storage devices that are substantially free of contaminants and, thus, may exhibit improved performance.

Figure 1:
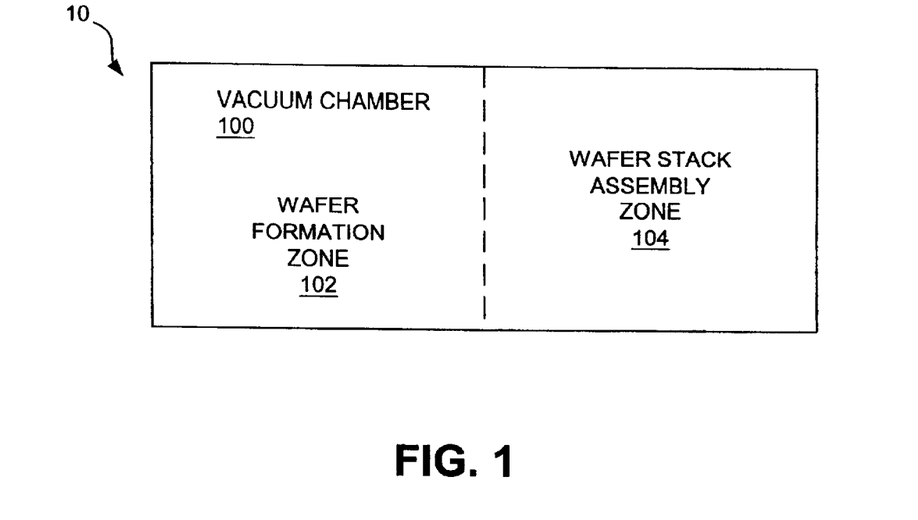
FIG. 1 is a schematic diagram depicting an embodiment of the vacuum assembly system of the present invention.

As shown in FIG. 1, an embodiment of a vacuum assembly system 10 includes a vacuum chamber 100. Vacuum chamber 100 defines multiple zones, such as wafer formation zone 102 and wafer stack assembly zone 104. Vacuum chamber 100 facilitates assembly of a wafer stack that can be formed, at least partially, under vacuum pressure maintained within the vacuum chamber. For example, the vacuum chamber may provide a high-intensity vacuum, i.e., a vacuum of approximately $10^{-8}$ Torr. As described in greater detail hereinafter, the wafers of a wafer stack define one or more interior chambers that can be maintained in vacuum.

Referring now to FIGS. 2 through 9, a representative data storage device 200 employing ARS tech technology is presented. It is noted that data storage device 200 is similar in construction to that described in U.S. Pat. No. 5,557,596, which is incorporated by reference herein.

Figure 2:
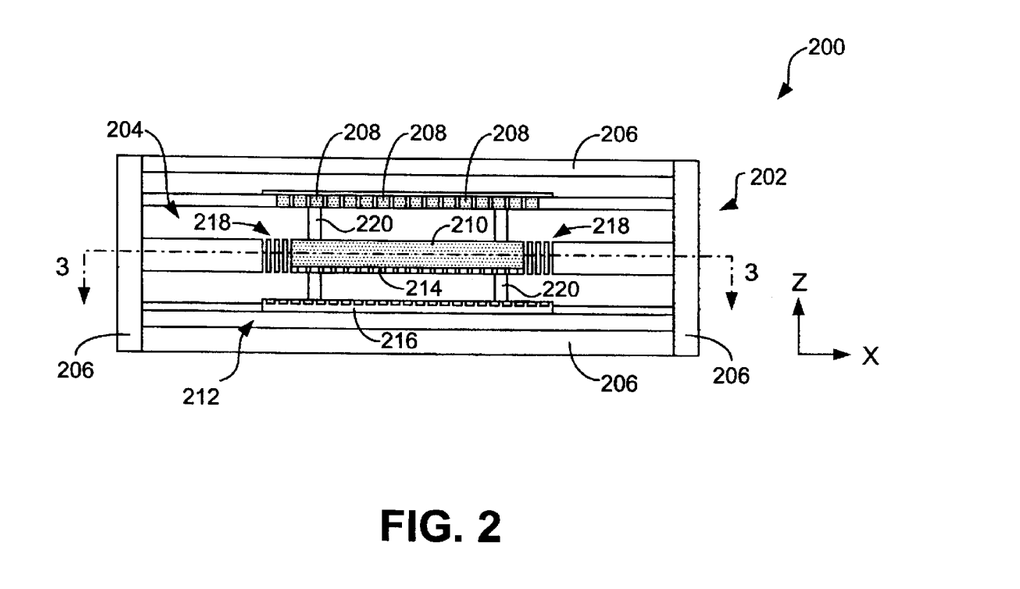
FIG. 2 is a schematic, side view of a representative data storage device.
Figure 3:
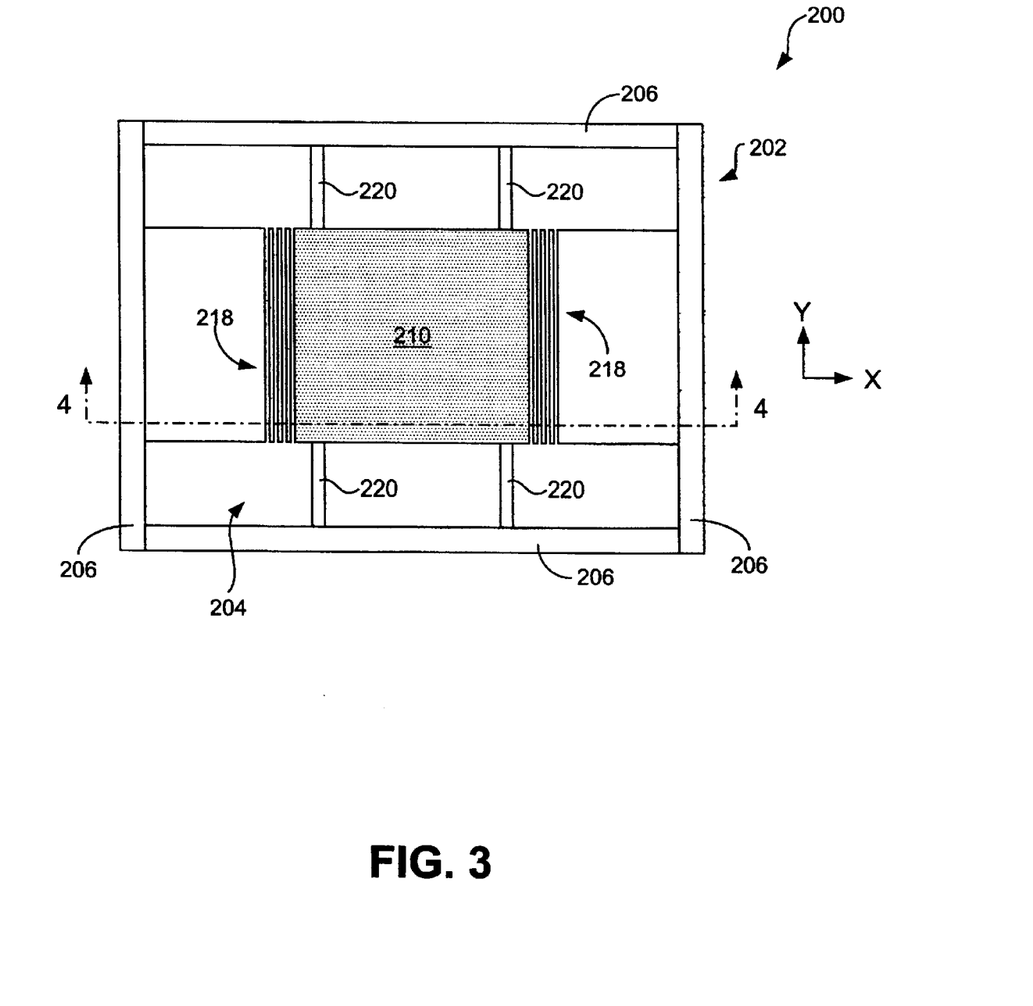
FIG. 3 is a schematic, cross-sectional view of the data storage device of FIG. 2 taken along line 3—3.
Figure 4:
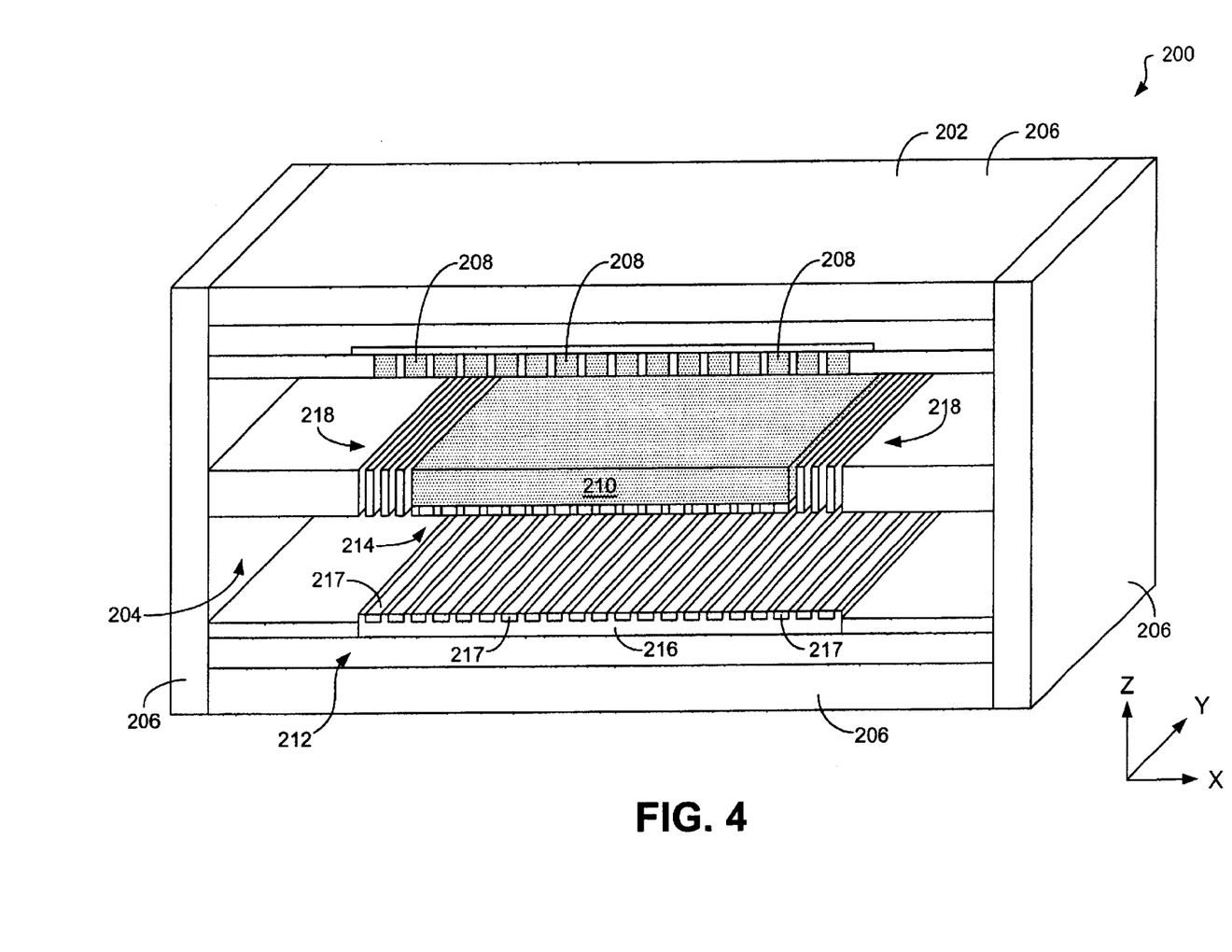
FIG. 4 is a schematic, cross-sectional view of the data storage device of FIGS. 2 and 3 taken along line 4—4.

As indicated in FIGS. 2–4, data storage device 200 generally includes an outer casing 202 that defines an interior space 204. By way of example, the casing 202 can include walls 206 that define the interior space. Typically, walls 206 are sealed to each other so that a vacuum can be maintained within the interior space. For instance, a vacuum of at least approximately $10^{-3}$ Torr is maintained within the interior space in some embodiments. Although a particular configuration is shown for the casing 202, it is to be understood that the casing can take many different forms that would be readily apparent to persons having ordinary skill in the art.

Within interior space 204 are electron emitters 208 that face a storage medium 210. These electron emitters can, for example, include field (i.e., tip) emitters, such as described in U.S. Pat. No. 5,557,596. Alternatively, the electron emitters 208 can include flat emitters, such as those described in U.S. patent application Ser. No. 09/836,124, filed Apr. 16, 2001, which is incorporated by reference herein. Various other emitters also can be used.

Figure 5:
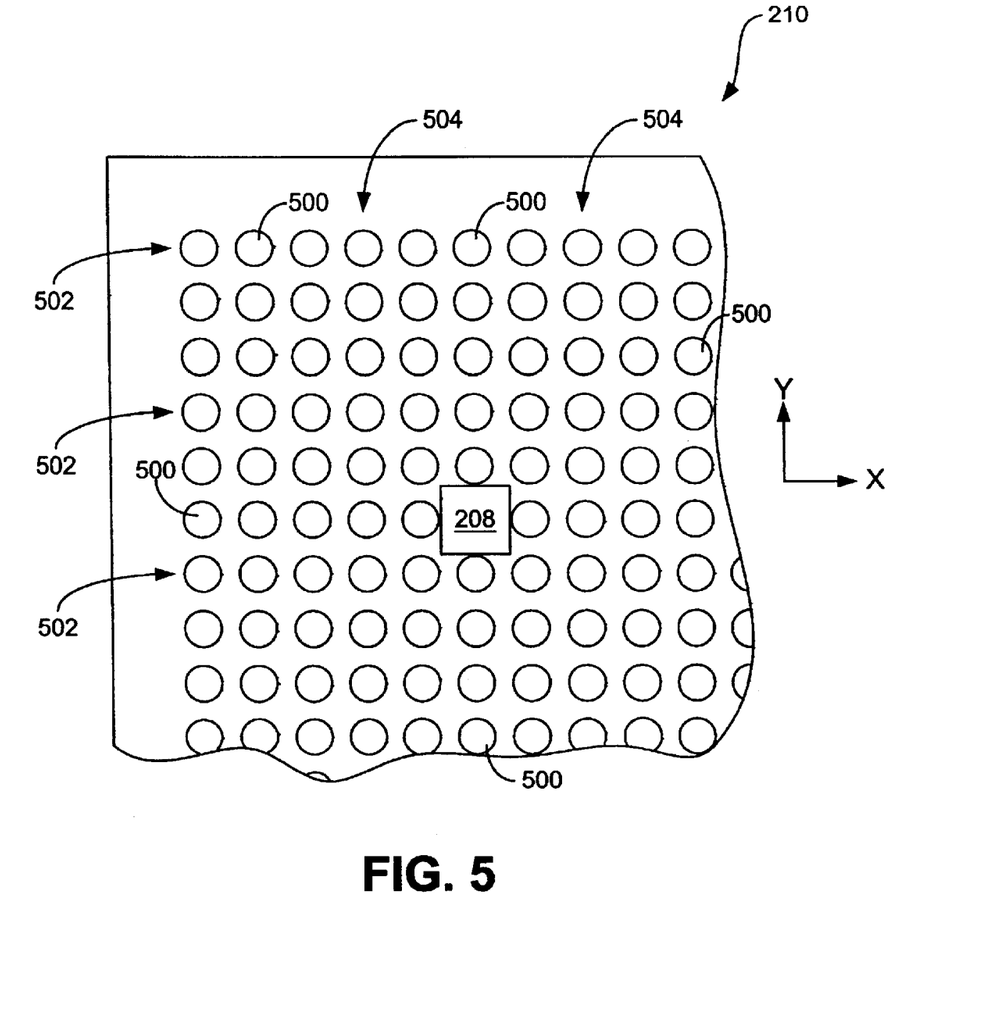
FIG. 5 is a partially cut-away, schematic view of a storage medium of the data storage device shown in FIGS. 2–4.

As described in relation to FIG. 5, storage medium 210 includes a plurality of storage areas (not visible in FIGS. 2–4). In a preferred embodiment, each storage area of the storage medium 210 is configured to store one or bits more of data. Electron emitters 208 are configured to emit electron beam currents toward the storage areas of storage medium 210 when a predetermined potential difference is applied to the electron emitters. Depending upon the distance between the emitters and the storage medium, the type of emitters, and the spot size (i.e., bit size) required, electron optics may be useful in focusing the electron beams. Voltage also can be applied to the storage medium to accelerate the emitted electrons to aid in focusing the emitted electrons.

Each electron emitter 208 can serve multiple storage areas of storage medium 210. To facilitate alignment between each electron emitter 208 and an associated storage area, the electron emitters and storage medium can be moved relative to each other, such as in the X and Y directions noted in FIG. 2. To provide for this relative movement, data storage device 200 can include a micromover 212 that scans the storage medium 210 with respect to the electron emitters 208. As indicated in FIGS. 2 and 4, micromover 212 can include a rotor 214 connected to the storage medium 210, a stator 216 that faces the rotor, and one or more springs 218 that are positioned to the sides of the storage medium. As is known in the art, displacement of the rotor 214, and thereby the storage medium 210, can be initiated by the application of appropriate potentials to electrodes 217 of the stator 216 so as to create a field that displaces the rotor 214 in a desired manner.

When micromover 212 is displaced, the micromover scans the storage medium 210 to different locations within the X-Y plane so that each emitter 208 can be positioned above a particular storage area. A preferred micromover 212 preferably has sufficient range and resolution to position the storage areas 210 under the electron emitters 208 with high accuracy. By way of example, the micromover 212 can be fabricated through semiconductor microfabrication processes. Although relative movement between electron emitters 208 and storage medium 210 has been described as being accomplished through displacement of the storage medium, it will be understood that such relative movement can alternatively be obtained by displacing the electron emitters or by displacing both the electron emitters and the storage medium. Moreover, although a particular micromover 212 is shown and described herein, it will be appreciated by persons having ordinary skill in the art that alternative moving means could be employed to obtain such relative movement.

Alignment of an emitted beam and storage area can be further facilitated with deflectors (not shown). By way of example, the electron beams can be rastered over the surface of storage medium 210 by either electrostatically or electromagnetically deflecting them, as through use of electrostatic and/or electromagnetic deflectors positioned adjacent the emitters 208. Many different approaches to deflect electron beams can be found in literature on scanning electron microscopy (SEM), for example.

Electron emitters 208 are responsible for reading and writing information on the storage areas of the storage medium with the electron beams they produce. Therefore, electron emitters 208 preferably produce electron beams that are narrow enough to achieve the desired bit density for the storage medium 210 and provide the different power intensities needed for reading from and writing to the medium.

As indicated in FIGS. 2 and 3, data storage device 200 includes one or more supports 220 that support the storage medium 210 within the interior space 204. When provided, supports 220 typically are configured as thin-walled microfabricated beams that flex when storage medium 210 is displaced in the X and/or Y directions. It should be noted that various combinations of supports and/or springs can be used. As is further indicated in FIGS. 2 and 3, supports 220 each can be connected to the walls 206 of the casing 202 or, alternatively, to stator 216.

In a preferred embodiment, electron emitters 208 are contained within a two-dimensional array of emitters. By way of example, an array of 100×100 electron emitters 208 can be provided with an emitter pitch of approximately 5 to 100 micrometers in both the X and Y directions. As discussed above, each emitter 208 typically is used to access a plurality of storage areas of the storage medium 210. FIG. 5 schematically depicts a representative embodiment of this relationship. In particular, FIG. 5 illustrates a single electron emitter 208 positioned above a plurality of storage areas 500 of the storage medium 210.

As indicated in FIG. 5, the storage areas 500, like the electron emitters 208, are contained in a two-dimensional array. In particular, storage areas 500 are arranged in separate rows 502 and columns 504 on the surface of the storage medium 210. In a preferred embodiment, each emitter 208 is only responsible for a portion of the entire length of a predetermined numbers of rows 502. Accordingly, each emitter 208 normally can access a matrix of storage areas 500 of particular rows 502 and columns 504. However, since each data cluster typically is connected to a single external circuit, only one emitter of a data cluster is used at a time.

To address a storage area 500, micromover 212 is activated to displace storage medium 210 (and/or electron emitters 208) to align the storage area with a particular electron emitter. Typically, each emitter 208 can access tens of thousands to hundreds of millions of storage areas 500 in this manner. Storage medium 210 can have a periodicity of approximately 5 to 100 nanometers between any two storage areas 500, and the range of micromover 212 can be approximately 15 micrometers. As will be appreciated by persons having ordinary skill in the art, each of the electron emitters can be addressed simultaneously or in a multiplexed manner. A parallel-accessing scheme can be used to significantly increase the data rate of storage device 200.

Writing information to data storage device 200 is accomplished by temporarily increasing the power density of an electron beam produced by an electron emitter 208 to modify the surface state of a storage area 500 of storage medium 210. For instance, the modified state can represent a "1" bit, while the unmodified state can represent a "0" bit. Moreover, the storage areas can be modified to different degrees to represent more than two bit types, if desired. In a preferred embodiment, storage medium 210 is constructed of a material whose structural state can be changed from crystalline to amorphous by electron beams. Example materials are germanium telluride (GeTe) and ternary alloys based on GeTe. To change from the amorphous to the crystalline state, the beam power density can be increased and then slowly decreased. This increase/decrease heats the amorphous area and then slowly cools it so that the area has time to anneal into its crystalline state. To change from the crystalline to amorphous state, the beam power density is increased to a high level and then rapidly reduced. Although temporary modification of the storage medium 210 is described herein, it will be understood that permanent modification is possible where write-once-read-many (WORM) functionality is desired.

Reading is accomplished by observing the effect of the electron beam on storage area 500, or the effect of the storage area on the electron beam. During reading, the power density of the electron beam is kept low enough so that no further writing occurs. In a first reading approach, reading is accomplished by collecting the secondary and/or backscattered electrons when an electron beam with a relatively low (i.e., lower than that needed to write) power density is applied to storage medium 210. In that the amorphous state has a different secondary electron emission coefficient (SEEC) and backscattered electron coefficient (BEC) than the crystalline state, a different number of secondary and backscattered electrons are emitted from a storage area 500 when bombarded with a "read" electron beam. By measuring the number of secondary and backscattered electrons, the state of storage area 206 can be determined.

Figure 6:
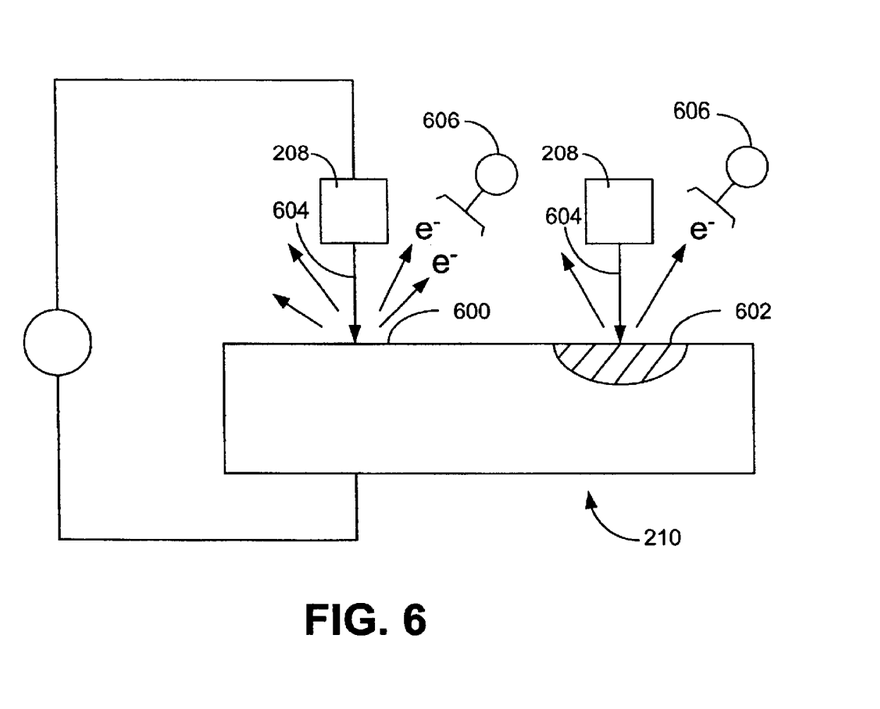
FIG. 6 is a schematic view of a representative reading/writing operation for the data storage device of FIGS. 2–5.

FIG. 6 illustrates a representative apparatus for reading in the manner described above. More particularly, FIG. 6 schematically illustrates electron emitters 208 reading from storage areas 600 and 602 of storage medium 210. In FIG. 6, the state of storage area 600 has not been modified, while the state of storage area 602 has been modified. When a beam 604 of electrons bombard the storage areas 600 and 602, both the secondary electrons and backscattered electrons are collected by electron collectors 606. As will be appreciated by persons having ordinary skill in the art, modified storage area 500 will produce a different number of secondary electrons and backscattered electrons as compared to unmodified storage area 602. The number may be greater or lesser depending upon the type of material and the type of modification made. By monitoring the magnitude of the signal current collected by the electron collectors 606, the state of and, in turn, the bit stored in the storage areas 600 and 602 can be identified.

Figure 7:
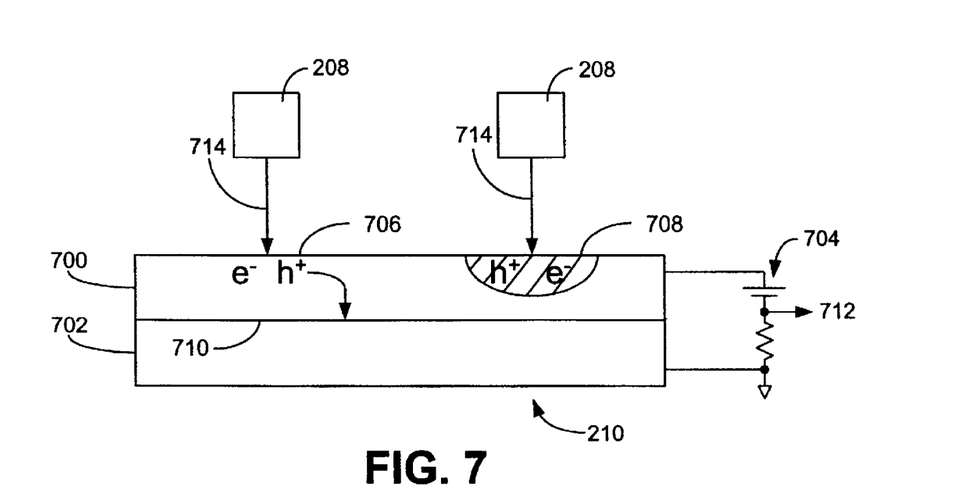
FIG. 7 is a schematic view of a representative reading/writing operation for the data storage device of FIGS. 2–5.

In another embodiment, a diode structure is used to determine the state of the storage areas 500. According to this approach, storage medium 210 is configured as a diode which can, for example, includes a p-n junction, a Schottky, barrier, or substantially any other type of electronic valve. FIG. 7 illustrates a representative example of such a storage medium 210. It will be understood that alternative diode arrangements (such as those shown in U.S. Pat. No. 5,557,596) are feasible.

As indicated in this FIG. 7, storage medium 210 is arranged as a diode that includes two layers, e.g., layers 600 and 602. By way of example, one of the layers is p type and the other is n type. Storage medium 210 is connected to an external circuit 704 that reverse-biases the storage medium. With this arrangement, bits are stored by locally modifying storage medium 210 in such a way that the collection efficiency for minority carriers generated by a modified region 708 is different than that of an unmodified region 706. The collection efficiency for minority carriers can be defined as the fraction of minority carriers generated by the instant electrons that are swept across a diode junction 710 of storage medium 210 when the medium is biased by the external circuit 604 to cause a signal current 712 to flow through the external circuit.

In use, electron emitters 208 emit narrow beams 714 of electrons onto the surface of the storage medium 210. These beams excite electron-hole pairs near the surface of the medium. Because storage medium 210 is reverse-biased by the external circuit 704, the minority carriers that are generated by the incident electrons are swept toward the diode junction 710. Electrons that reach the junction 710 are then swept across the junction. Accordingly, minority carriers that do not recombine with majority carriers before reaching the junction 710 are swept across the junction, causing a current flow in the external circuit 704.

As described above, writing is accomplished by increasing the power density of electron beams enough to locally alter the physical properties of storage medium 210. Where the medium 210 is configured as shown in FIG. 7, this alteration affects the number of minority carriers swept across the junction 710 when the same area is radiated with a lower power density "read" electron beam. For instance, the recombination rate in a written (i.e., modified) area 708 could be increased relative to an unwritten (i.e., unmodified) area 706 so that the minority carriers generated in the written area have an increased probability of recombining with minority carriers before they have a chance to reach and cross junction 710. Hence, a smaller current flows in external circuit 604 when the "read" electron beam is incident upon a written area 708 than when it is incident upon an unwritten area 706. Conversely, it is also possible to start with a diode structure having a high recombination rate and to write bits by locally reducing the recombination rate. The magnitude of the current resulting from the minority carriers depends upon the state of particular storage area, and the current continues the output signal 712 to indicate the bit stored.

Figure 8:
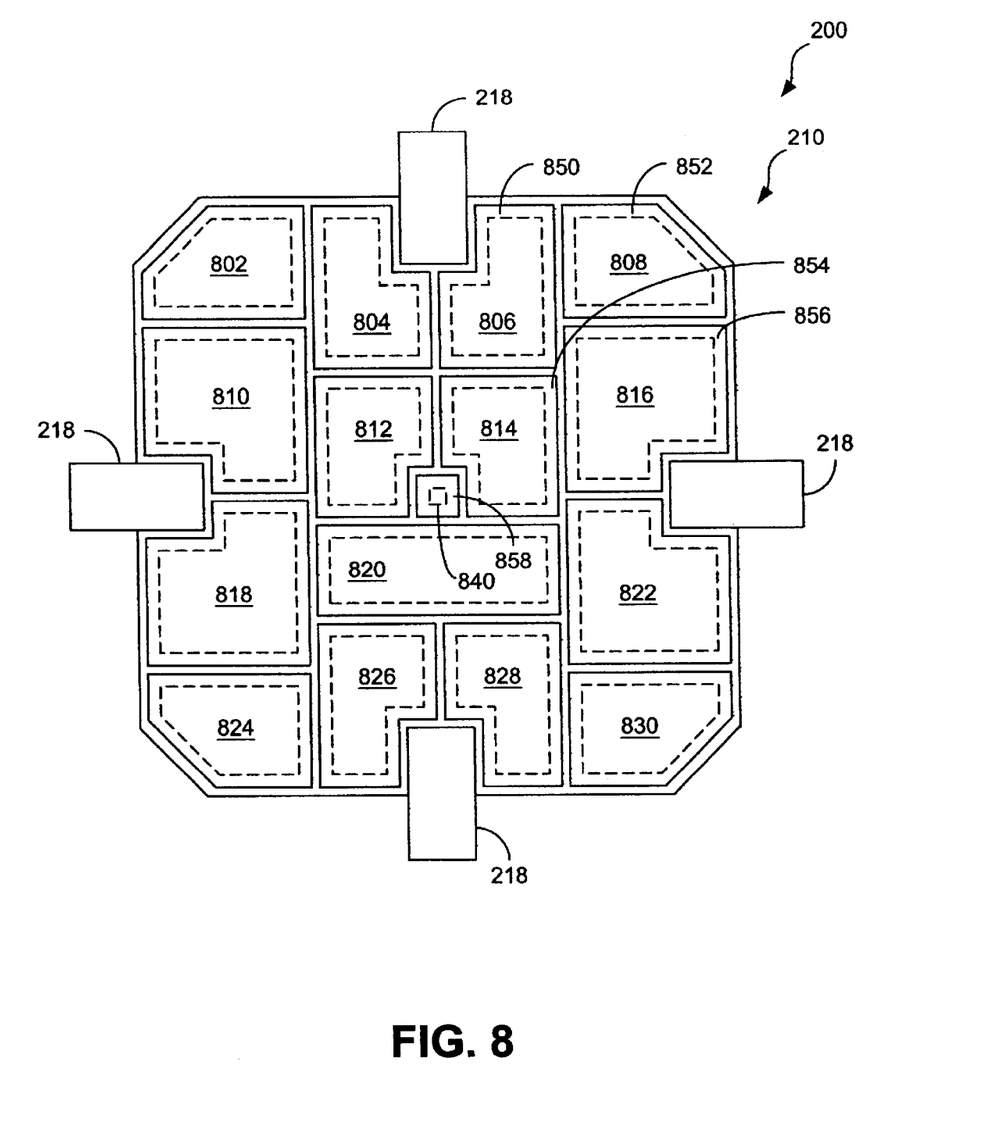
FIG. 8 is a schematic view of a storage medium of a representative data storage device.

Reference will now be made to FIG. 8, which schematically depicts a representative embodiment of a storage medium 210 of a data storage device 200. Flexures 218, such as springs, beams or other flexible support mechanisms, for example, extend from storage medium 210 and permit movement of the storage medium in some embodiments. As shown in FIG. 8, storage medium 210 includes multiple data clusters. In particular, fifteen (15) such data clusters, e.g., data clusters 802, 804, 806, 808, 810, 812, 814, 816, 818, 820, 822, 824, 828, and 830, are provided on storage medium 210. In other embodiments, however, various other numbers and configurations of data clusters can be provided. Each data cluster is capable of including multiple storage areas.

Each data cluster is associated with multiple electron emitters. For example, in some embodiments, over one hundred (100) emitters can be provided in each data cluster. Preferably, only one emitter associated with a particular data cluster is "on," e.g., either reading or writing data, at any given time. Additionally, an external circuit (not shown) is associated with each data cluster that facilitates transmission of data from the data cluster. For instance, each external circuit can include an amplifier, among other various components.

A servo cluster 840 is provided upon storage medium 210. Servo cluster 840 is configured to store data that is used for providing sensor feedback to a servo system (not shown). The servo system reads information from the servo cluster and uses the information to position the storage medium and emitters relative to the other.

Figure 9:
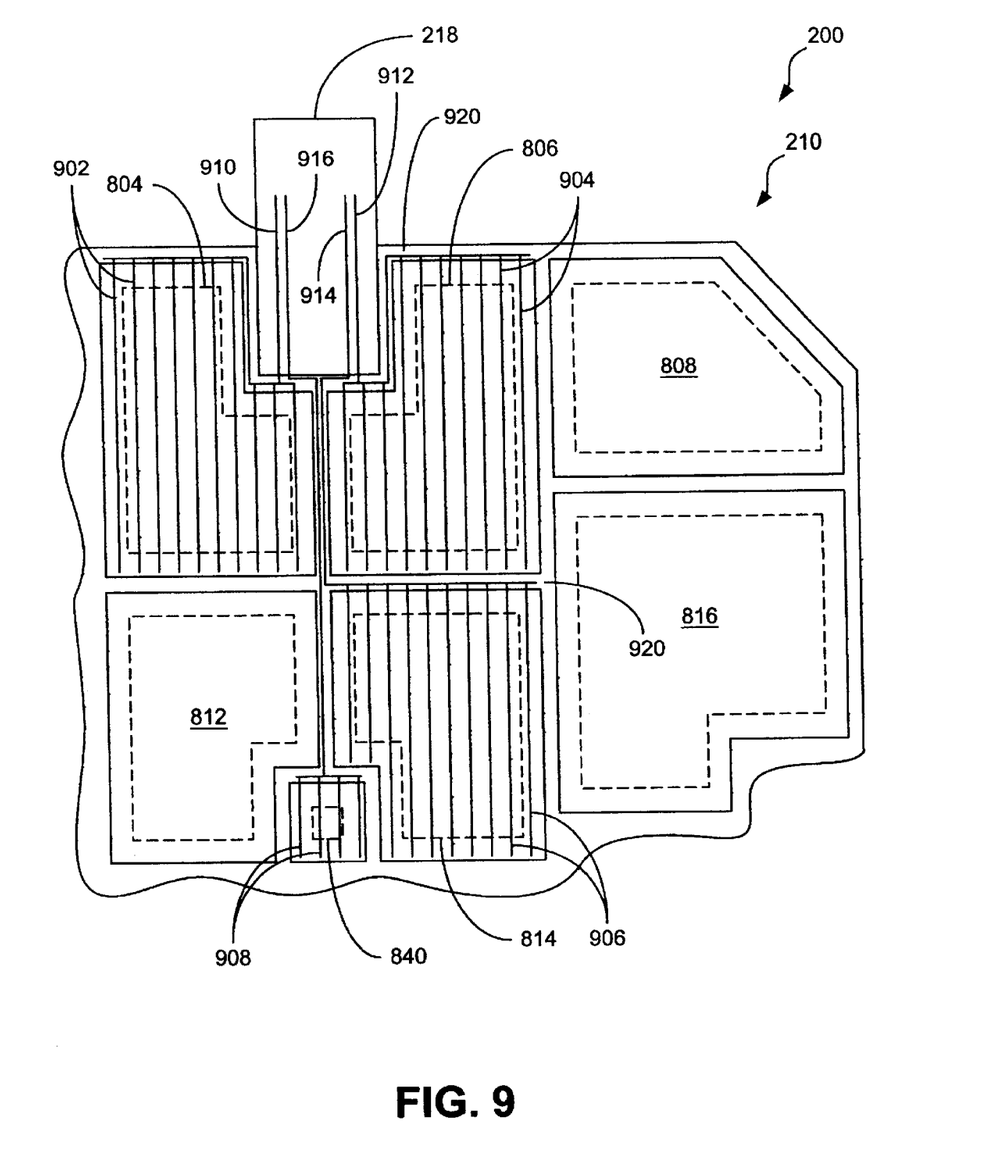
FIG. 9 is a partially cut-away, schematic view of the storage medium of FIG. 8 showing detail of a representative contact layout.

In FIG. 9, representative data clusters 802, 804, 806, and 808 of FIG. 8 are shown in greater detail. Representative contact areas that are configured to accommodate placement of electrical contacts and/or leads also are depicted in FIG. 9. As shown therein, contacts preferably are provided at spaced intervals across each data cluster. In particular, contacts 902 are associated with data cluster 804, contacts 904 are associated with data cluster 806, contacts 906 are associated with data cluster 814, and contacts 908 are associated with servo cluster 840. Each contact, in turn, electrically communicates with a corresponding lead. More specifically, contacts 902 electrically communicate with lead 910, contacts 904 electrically communicate with lead 912, contacts 906 electrically communicate with lead 914, and contacts 908 electrically communicate with lead 916. The leads can be adapted to provide electrical signals to and/or from storage areas of the corresponding data clusters. Contact areas 920 accommodate placement of at least some of the electrical contacts and/or leads.

Figure 10:
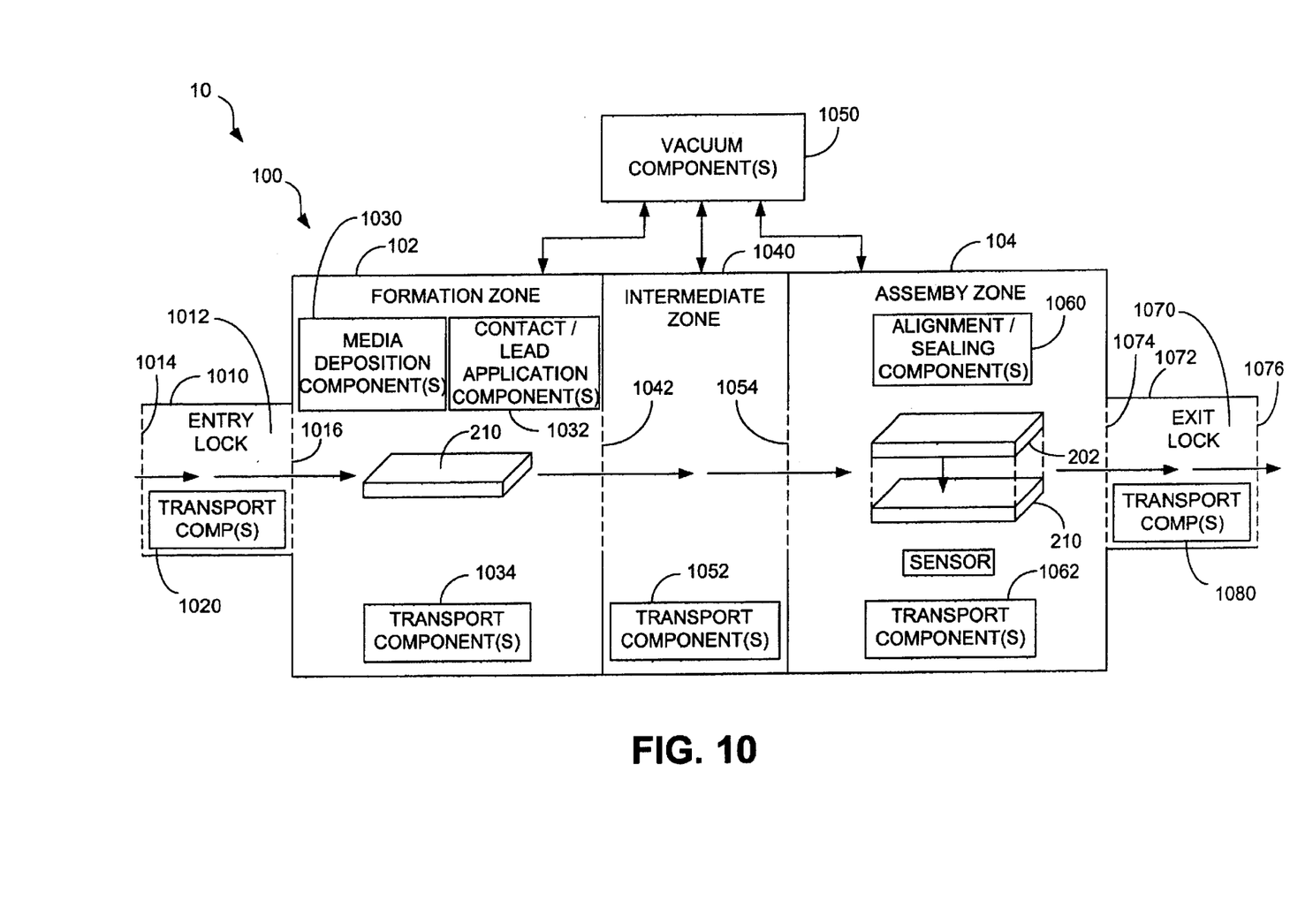
FIG. 10 is a schematic diagram depicting an embodiment of the vacuum chamber of FIG. 1, showing detail of representative chamber components.

Reference will now be made to FIG. 10, which depicts an embodiment of vacuum chamber 100 that can be used for assembling a data storage device. In FIG. 10, vacuum chamber 100 includes a formation zone 102 that selectively communicates with an entry lock 1010. Entry lock 1010 defines an entry chamber 1012 that is adapted to receive a wafer 210 for processing. The wafer is adapted to include storage media and may be configured as a rotor wafer. Access to entry chamber 1012 is provided by an entry mechanism 1014. Entry mechanism 1014 can be a door or any other suitable component or combination of components that are adapted to selectively provide access to the entry lock. Entry lock 1010 also includes an egress component that is adapted to selectively enable entry chamber 1012 to communicate with formation zone 102. Egress component 1016 also can be a door or other suitable component(s).

Transport component(s) are provided within vacuum chamber 100. For example, transport component(s) can be adapted to facilitate transport of one or more wafers through the various chambers and/or zones of the vacuum chamber. In FIG. 10, a separate transport component is depicted substantially within each chamber/zone. For instance, transport component 1020 is provided in entry lock 1010. In other embodiments, however, a particular assembly of transport components could facilitate transport of one or more wafers between multiple chambers and/or zones.

Formation zone 102 includes components required for forming storage media on wafer 210. In particular, formation zone 102 can include media deposition component(s) 1030 and/or contact/lead application component(s) 1032. In some embodiments, storage media is deposited onto wafer 210 via a vapor deposition technique. In these embodiments, media deposition component 1030 includes one or more deposition material receptacles (not shown) that are adapted to store an amount of deposition material that will be required to complete the storage media deposition process. Each receptacle can be selectively provided within the formation zone so that material contained within the receptacle can be appropriately vaporized and applied to wafer 210.

Prior to being provided within formation zone 102, wafer 210 can be appropriately masked. Masking of the wafer will prevent deposition of material at other than unmasked locations of the wafer. In other embodiments, components that are adapted to facilitate masking of wafer 210 within the formation zone can be provided within vacuum chamber 100.

Once material, e.g., storage media, has been deposited upon the wafer, various other wafer processing can occur. For example, contact/lead application components 1032 can apply one or more contacts and/or one or more leads to the wafer. A representative arrangement of storage media, contacts and leads was depicted in FIG. 9.

After applicable wafer processing has been completed within the formation zone, the wafer can be transported, such as via transport component 1034, from the formation zone to an intermediate zone 1040. As depicted in FIG. 10, intermediate zone 1040 is arranged between formation zone 102 and assembly zone 104. In this embodiment, the intermediate zone selectively communicates with each zone and effectively isolates contaminants that may be contained in the formation zone from entering the assembly zone. Selective communication of the intermediate zone with the formation zone is facilitated by an entry mechanism 1042, e.g., a door. Thus, after processing within formation zone 102, wafer 210 can be transported into intermediate zone 1040 through operation of entry mechanism 1042.

Upon entering the intermediate zone, entry mechanism 1042 closes to isolate the formation zone from the intermediate zone. By so doing, contaminants contained in the formation zone may be removed, such as by action of vacuum components 1050. Vacuum components 1050 can communicate with one or more of the various zones and/or chambers of the vacuum chamber 100 to selectively maintain a vacuum within one or more of the zones and/or chambers. By providing the vacuum, contaminants also can drawn from the formation zone. This could include deposition material that did not deposit upon wafer 210.

Wafer 210 can be transported from the intermediate zone by transport component(s) 1052. An egress mechanism 1054 enables the intermediate zone to selectively communicate with assembly zone 104. Thus, wafer 210 is able to enter the assembly zone when the egress mechanism, e.g., a door, is in its open position.

Assembly zone 104 includes alignment/sealing component(s) 1060 that are adapted to align wafer 210 and 202 and seal the wafers together so that a vacuum is maintained within one or more chambers defined between the wafers. Once appropriate sealed, transport component 1062 can deliver the sealed wafers (wafer stack) to a chamber 1070 defined by exit lock 1072. Access to chamber 1070 is selectively provided by an entry mechanism 1074, e.g., a door, when the entry mechanism is in its open position. Once positioned within chamber 1070, the entry mechanism can close, thereby maintaining the vacuum within at least a portion of chamber 100. Access to the wafer stack positioned within chamber 1070 is provided by an egress mechanism 1076. Transport component(s) 1080 can be used to promote removal of the wafer stack from chamber 100.

Figure 11:
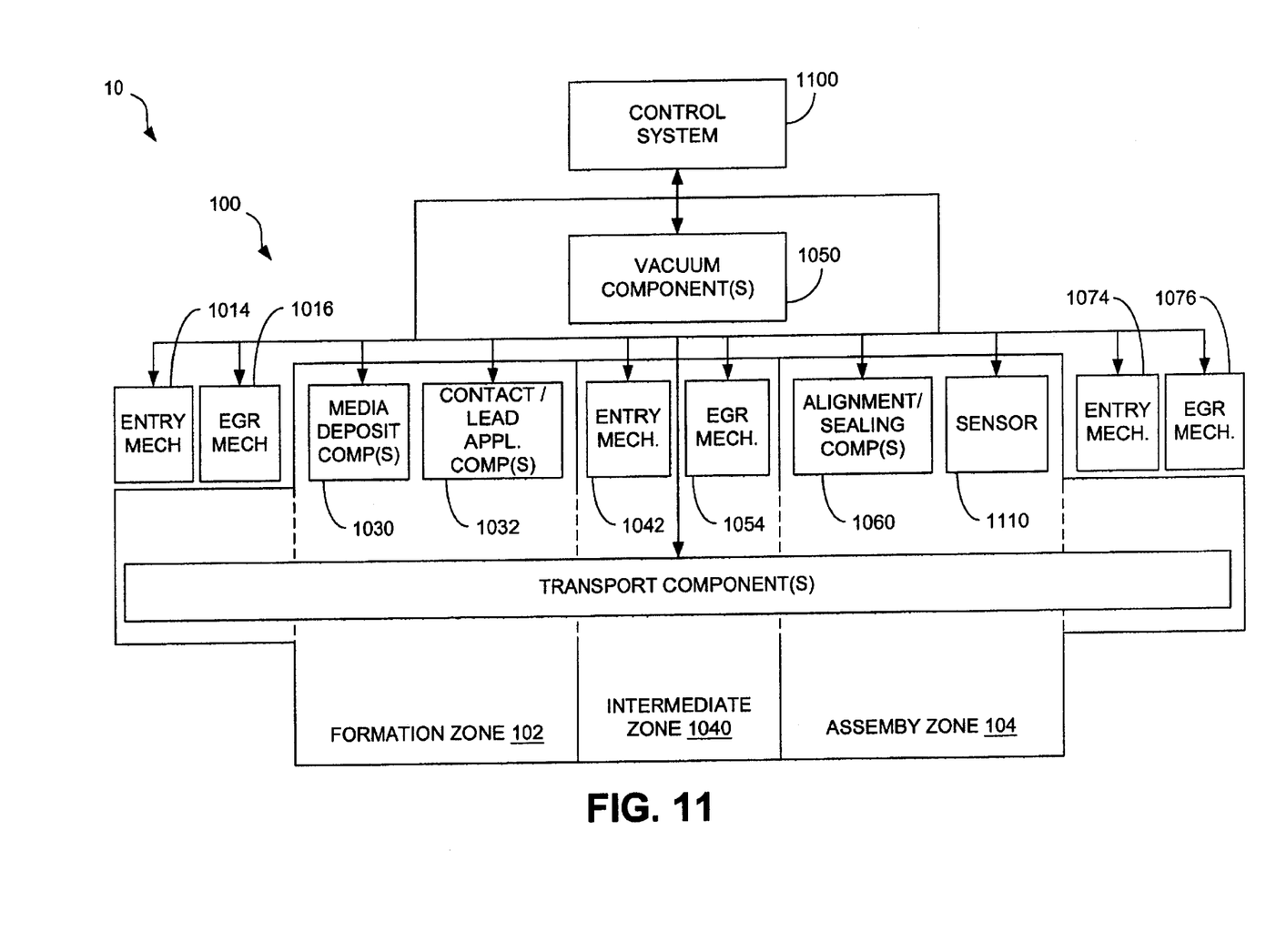
FIG. 11 is a schematic diagram of an embodiment of the vacuum chamber of FIG. 1, showing detail of a representative control system.

Embodiments of the vacuum assembly system can facilitate automatic formation and assembly of wafer stacks. In these embodiments, a control system, such as control system 1100 (FIG. 11), can be utilized. In FIG. 11, control system 1100 electrically communicates with various components of the vacuum assembly system. More specifically, control system 1100 communicates with one or more of entry mechanism 1014, egress mechanism 1016, media deposition component(s) 1030, contact/lead application component(s) 1032, entry mechanism 1042, egress mechanism 1054, vacuum component 1050, alignment/sealing component 1060, entry mechanism 1075, egress mechanism 1076, and one or more of various control components. Additionally, control system 1100 can communicate with one or more sensors 1110. More specifically, a sensor 1110 can be adapted to sense the vacuum pressure within one or more zones and/or chambers of vacuum chamber 100 and provide a corresponding signal to the control system. So provided, information provided by sensor 1100 can be used by the control system to operate the vacuum components for maintaining the vacuum within the chamber 100 at a suitable level.

Control system 1100 can be implemented in software, firmware, hardware, or a combination thereof. When implemented in hardware, the control system can be implemented with any or a combination of various technologies. By way of example, the following technologies, which are each well known in the art, can be used: a discrete logic circuit(s) having logic gates for implementing logic functions upon data signals, an application specific integrated circuit (ASIC) having appropriate combinational logic gates, a programmable gate array(s) (PGA), and a field programmable gate array (FPGA).

In an alternative embodiment, the control system 1100 is implemented in software as an executable program. The control system can be executed by a special or general purpose digital computer, such as a personal computer (PC; IBM-compatible, Apple-compatible, or otherwise), workstation, minicomputer, or mainframe computer. An example of a general purpose computer that can implement the control system is shown schematically in FIG. 12.

Figure 12:
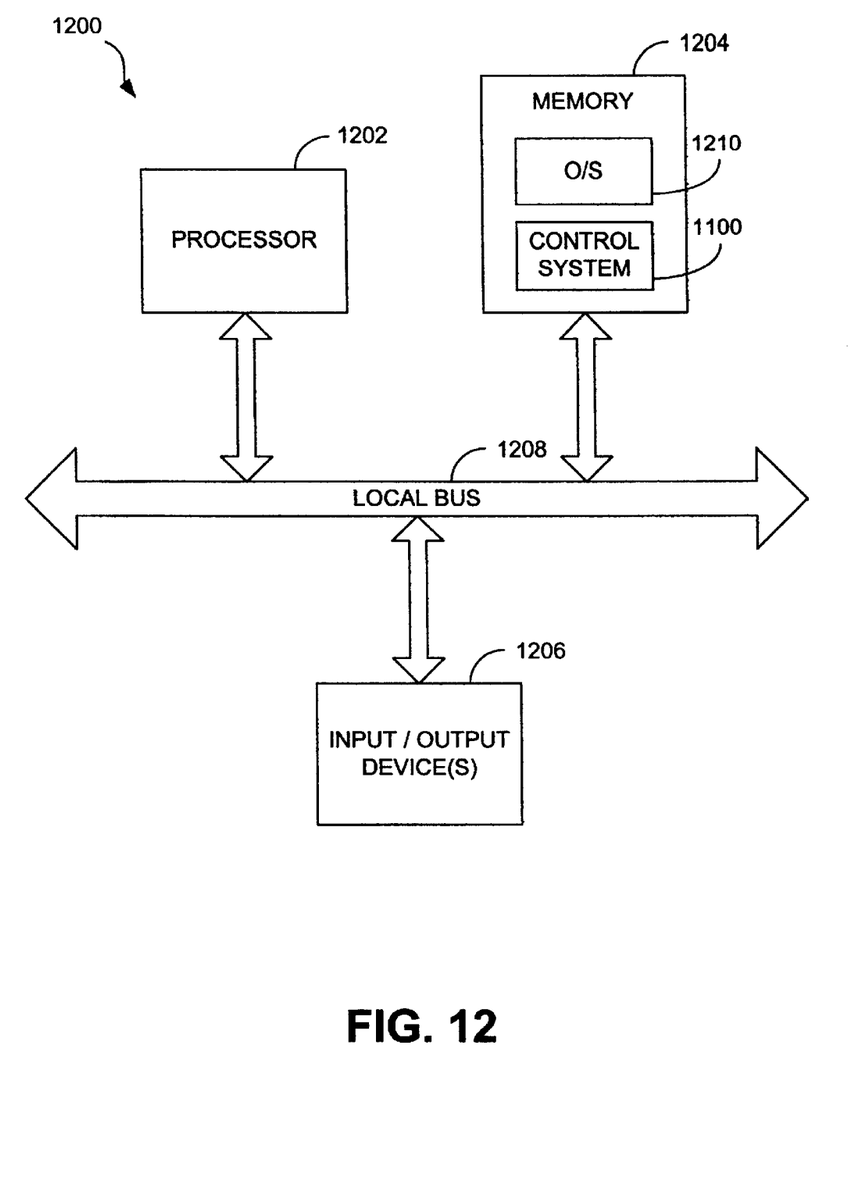
FIG. 12 is a schematic diagram of a computer or processed-based system that may be used to implement the control system of FIG. 11.

Generally, in terms of hardware architecture, computer 1200 includes a processor 1202, memory 1204, and one or more input and/or output (I/O) devices 1206 (or peripherals) that are communicatively coupled via a local interface 1208. Local interface 1208 can be, for example, one or more buses or other wired or wireless connections, as is known in the art. Local interface 1208 can include additional elements, which are omitted for ease of description. These additional elements can be controllers, buffers (caches), drivers, repeaters, and/or receivers, for example. Further, the local interface may include address, control, and/or data connections to enable appropriate communications among the components of computer 1200.

Processor 1202 is a hardware device configured to execute software that can be stored in memory 1204. Processor 1202 can be any custom made or commercially avail-able processor, a central processing unit (CPU) or an auxiliary processor among several processors associated with the computer 1200. Additionally, the processor can be a semi-conductor-based microprocessor (in the form of a microchip) or a macroprocessor. Examples of representative commercially available microprocessors are as follows: a PA-RISC series microprocessor from Hewlett-Packard Company, U.S.A., an 80×86 or Pentium series microprocessor from Intel Corporation, U.S.A., a PowerPC microprocessor from IBM, U.S.A., a Sparc microprocessor from Sun Microsystems, Inc, or a 68control series microprocessor from Motorola Corporation, U.S.A.

Memory 1204 can include any combination of volatile memory elements (e.g., random access memory (RAM, such as DRAM, SRAM, etc.)) and/or nonvolatile memory elements (e.g., ROM, hard drive, tape, CDROM, etc.). Moreover, memory 1204 can incorporate electronic, magnetic, optical, and/or other types of storage media. Note that memory 1204 can have a distributed architecture, where various components are situated remote from one another, but can be accessed by processor 1202.

The software in memory 1204 can include one or more separate programs, each of which comprises an ordered listing of executable instructions for implementing logical functions. In the example of FIG. 11, the software in the memory 1204 includes the control system 1100 and a suitable operating system (O/S) 1210. A nonexhaustive list of examples of commercially available operating systems 1210 is as follows: a Windows operating system from Microsoft Corporation, U.S.A., a Netware operating system available from Novell, Inc., U.S.A., or a UNIX operating system, which is available for purchase from many vendors, such as Hewlett-Packard Company, U.S.A., Sun Microsystems, Inc., and AT&T Corporation, U.S.A. The operating system 1210 controls the execution of other computer programs, such as the control system 1100. Operating system 1210 also provides scheduling, input-output control, file and data management, memory management, and communication control and related services.

The I/O device(s) 1206 can include input devices such as a keyboard, for example. I/O device(s) 1206 also can include output devices such as a display, for example. I/O device(s) 1206 may further include devices that are configured to communicate both inputs and outputs such as a modulator/demodulator, for example.

When the computer 1200 is in operation, processor 1202 is configured to execute software stored within the memory 1204, communicate data to and from the memory 1204, and generally control operations of the computer 1200. The control system 1100 and the O/S 1210, in whole or in part, are read by the processor 1202, perhaps buffered within processor 1202, and then executed.

When control system 1100 is implemented in software, it should be noted that the control system can be stored on any computer readable medium for use by or in connection with any computer-related system or method. In the context of this document, a computer-readable medium is an electronic, magnetic, optical, or other physical device or means that can contain or store a computer program for use by or in connection with a computer-related system or method. Control system 1100 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 13:
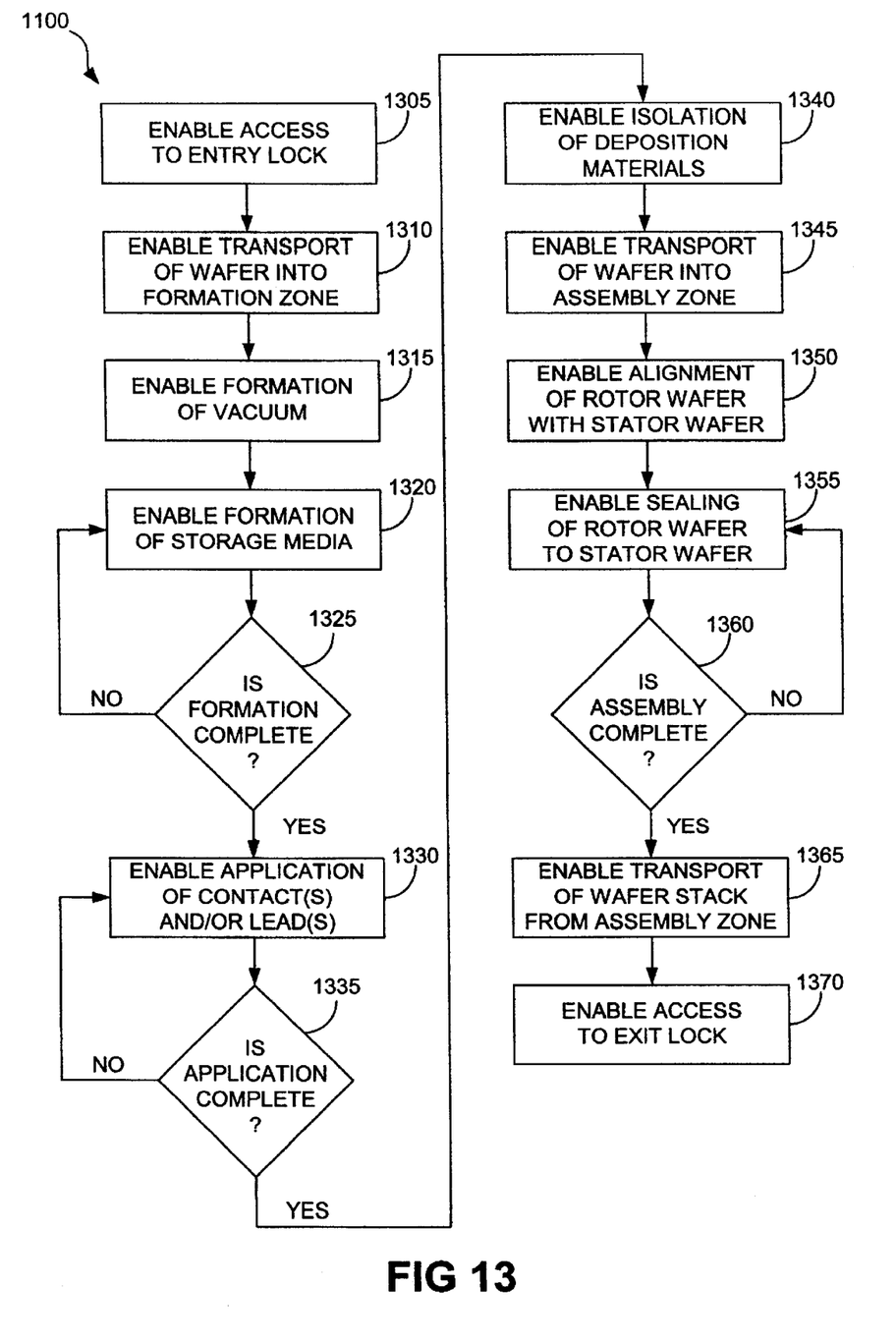
FIG. 13 is a flowchart depicting functionality of an embodiment of the control system of FIG. 12.

The flowchart of FIG. 13 shows the functionality of an implementation of the control system. In this regard, each block of the flowchart represents a module segment or portion of code which comprises one or more executable instructions for implementing the specified logical function or functions. It should also be noted that in some alternative implementations, the functions noted in the various blocks may occur out of the order depicted in FIG. 13. For example, two blocks shown in succession in FIG. 13 may, in fact, be executed substantially concurrently where the blocks may sometimes be executed in the reverse order depending upon the functionality involved. In this regard, the control system or method 1100 of FIG. 13 may be construed as beginning at block 1305 where access to the entry lock is enabled. More specifically, the control system can send a signal to the entry mechanism that prompts the entry mechanism to move to its open position. In block 1310, transport of the wafer into the formation zone is enabled. In some embodiments, this can include providing a signal to transport component 1020 so that the wafer is transported from the entry lock into the formation zone. In those embodiments incorporating an egress mechanism 1016, a signal also can be sent to the egress entry mechanism to ensure that the egress mechanism is in its open position. This can enable the wafer to be transported from the entry lock into the formation zone.

In block 1315, formation of a vacuum within one or more chambers and/or zones of the vacuum chamber 100 is enabled. In some embodiments, this can include ensuring that the egress mechanism 1016 is in its closed position. Once a suitable vacuum has been established within the formation zone, the process may proceed to block 1320 where formation of storage media is enabled. As mentioned hereinbefore, this can include providing material in an appropriate arrangement within the formation zone so that vapor deposition of the material can be carried out. In block 1325, a determination may be made as to whether formation of the storage media is complete. If it is determined that the formation is not complete, the process may return to block 1320 and the formation process can be continued until complete. Upon completion, the process may proceed to block 1330 where the application of more or more contacts and/or one or more leads to the storage media is enabled. In block 1335, a determination then can be made as to whether the application process is complete. If it is determined that application of one or more contacts and/or one or more leads is not complete, the process may return to block 1330 until completion. Upon completion, the process may proceed to block 1340 where isolation of deposition materials is enabled within the formation zone. More specifically, further wafer processing may be discontinued until contaminants are removed from the formation zone, such as by vacuum components. In other embodiments, the wafer may be transported to the intermediate zone and contained therein until contaminants are removed.

Once contaminants are appropriately removed from one or more zones and/or chambers of the vacuum chamber, the wafer can be transported into the assembly zone. Thereafter, alignment of a rotor wafer with the stator wafer is enabled (block 1350). In block 1355, the wafers are sealed together to form a wafer stack. As mentioned hereinbefore, maintenance of the vacuum within the assembly zone permits the wafers to be sealed together while maintaining an interior chamber of the wafer stack under vacuum. Proceeding to block 1360, a determination may be made as to whether the assembly process is complete. If it is determined that the process is not complete, the process may return to block 1355 until completion. If, however, assembly is complete, the process may proceed to block 1365 where transport of the wafer stack from the assembly zone is enabled. In block 1370, access to the assembled wafer stack is provided, such as providing access to the wafer via the exit lock.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated. All such modifications and variations, are within the scope of the invention as determined by the appended claims when interpreted in accordance with the breadth to which they are fairly and legally entitled.

What is claimed is:

1. A method for forming a data storage device comprising:

providing a first wafer and a second wafer, the first wafer and second wafer being configured to define therebetween an interior chamber;

providing a vacuum chamber, the vacuum chamber defining a first zone;

placing the first wafer within the vacuum chamber;

maintaining the first wafer under vacuum pressure within the vacuum chamber;

depositing storage media upon the first wafer;

removing contaminants from a vicinity of the first wafer;

bonding the first wafer and the second wafer together to form a wafer stack such that the interior chamber is maintained under vacuum pressure after the first wafer and second wafer are bonded together; and providing a first chamber selectively pneumatically communicating with the first zone such that, when the first chamber is not pneumatically communicating with the first zone, the first wafer can be placed in the first chamber, and when the first chamber is pneumatically communicating with the first zone, the first wafer can be transported from the first chamber and into the first zone.

2. The method of claim 1, wherein some of the contaminants are removed from the vicinity of the first wafer by the vacuum chamber.

3. The method of claim 1, further comprising:

applying at least one of a contact and a lead to the first wafer after the storage media is deposited upon the first wafer.

4. The method of claim 1, wherein the first wafer is maintained under a first vacuum pressure as the first wafer and the second wafer are bonded together to form the wafer stack, the first vacuum pressure corresponding to a vacuum pressure to be maintained in the interior chamber of the wafer stack.

5. The method of claim 1, wherein some of the contaminants are removed from the vicinity of the first wafer by transporting the first wafer out of the first zone.

6. The method of claim 1, wherein the vacuum chamber defines a second zone separated from the first zone; and further comprising:

transporting the first wafer from the first zone to the second zone after the storage media is deposited upon the first wafer.

7. The method of claim 3, wherein the vacuum chamber defines a second zone separated from the first zone; and further comprising:

transporting the first wafer from the first zone to the second zone after at least one of a contact and a lead is applied to the first wafer.

8. A method for forming a data storage device comprising:

providing a first wafer and a second wafer, the first wafer and second wafer being configured to define therebetween an interior chamber;

providing a vacuum chamber, the vacuum chamber defining a first zone and a second zone, the second zone being separated from the first zone;

placing the first wafer within the vacuum chamber;

maintaining the first wafer under vacuum pressure;

depositing storage media upon the first wafer within the first zone;

removing contaminants from a vicinity of the first wafer;

bonding the first wafer and the second wafer together to form a wafer stack such that the interior chamber is maintained under vacuum pressure after the first wafer and second wafer are bonded together;

transporting the first wafer from the first zone to the second zone after the storage media is deposited upon the first wafer; and providing a second chamber selectively pneumatically communicating with the second zone such that, when the second chamber is pneumatically communicating with the second zone, the wafer can be transported from the second zone and into the second chamber, and when the second chamber is not pneumatically communicating with the second zone, the wafer stack can be removed from the second chamber.

9. The method of claim 8, wherein the storage media is deposited upon the first wafer within the first zone.

10. The method of claim 8, wherein some of the contaminants are removed from the vicinity of the first wafer by the vacuum chamber.

11. The method of claim 8, further comprising:

applying at least one of a contact and a lead to the first wafer after the storage media is deposited upon the first wafer.

12. The method of claim 8, wherein the first wafer is maintained under a first vacuum pressure as the first wafer and the second wafer are bonded together to form the wafer stack, the first vacuum pressure corresponding to a vacuum pressure to be maintained in the interior chamber of the wafer stack.

13. The method of claim 8, wherein some of the contaminants are removed from the vicinity of the first wafer by transporting the first wafer out of the first zone.

* * * * *